United States Patent [19]

Goland et al.

[11] Patent Number: 6,002,951
[45] Date of Patent: Dec. 14, 1999

[54] MULTI-LAYER CERAMIC SUBSTRATE HAVING HIGH TC SUPERCONDUCTOR CIRCUITRY

[75] Inventors: David B. Goland, Croton-On-Hudson; Richard A. Shelleman, Poughkeepsie; Subhash L. Shinde, Cortlandt Manor; Lisa M. Studzinski; Rao V. Vallabhaneni, both of Wappingers Falls, all of N.Y.

[73] Assignee: International Business Machines Corporation, Armonk, N.Y.

[21] Appl. No.: 08/968,191

[22] Filed: Nov. 12, 1997

[51] Int. Cl.$^6$ ..................................... H01L 39/00
[52] U.S. Cl. ........................... 505/220; 505/236; 428/930
[58] Field of Search ..................... 505/220, 236, 505/701; 427/62, 96; 428/930

[56] References Cited

U.S. PATENT DOCUMENTS

| | | |
|---|---|---|
| 4,137,628 | 2/1979 | Suzuki . |
| 4,234,367 | 11/1980 | Herron et al. . |
| 4,803,110 | 2/1989 | Ahn et al. . |
| 4,902,371 | 2/1990 | Andris et al. . |
| 5,274,268 | 12/1993 | Yamazaki ................................. 257/663 |
| 5,747,873 | 5/1998 | Talisa et al. ............................. 257/661 |

OTHER PUBLICATIONS

Van Nostrand Reinhold, "Microelectronics Packaging Handbook", 1989, pp. 476–493 No month data.

*Primary Examiner*—Roy V. King
*Attorney, Agent, or Firm*—DeLio & Peterson LLC; John J. Tomaszewski; Aziz M. Ahsan

[57] ABSTRACT

A multilayer ceramic substrate electronic component is provided having high temperature superconductor material circuitry. The high temperature superconductor material is preferably yttrium-barium-copper-oxide and is encased within a noble metal such as silver or gold when forming the surface circuitry or filling of the vias. The noble metal layers preferably have through-openings to enable direct connection of circuitry to the encased superconductor layer. A method is also provided for fabricating such multilayer ceramic substrate electronic components.

8 Claims, 2 Drawing Sheets

MULTI-LAYER CERAMIC SUBSTRATE HAVING HIGH TC SUPERCONDUCTOR CIRCUITRY

BACKGROUND OF THE INVENTION

1. Field of the Invention

The present invention relates to electronic components such as multilayer ceramic (MLC) electronic components and, more particularly, to the use of high temperature superconductors as wiring in the multilayer ceramic circuit structure.

2. Description of Related Art

The scale of integration in integrated circuits has steadily increased over the years resulting in integrated circuits with extreme complexity and capable of very comprehensive functions. While any electronic component may be used with the subject invention, the description will be directed to a structure which uses a plurality of layers of glass, ceramic or other insulating material of relatively high thermal conductivity with conductors formed on the respective surfaces and in through-holes (vias) in the layers. These components are typically termed multilayer ceramics (MLC) and since circuits constructed in this way are three dimensional, a high degree of complexity is possible. Even with this increased complexity and circuit density however, there is still a need for large size and/or densely wired high end modules for use in low temperature computing. High temperature superconductor wiring has been proposed for use in the fabrication of the electronic components.

In conventional MLC structures, the conductors are usually formed by applying the desired pattern on the substrate using a conductive paste. The conductive paste pattern is usually formed by extruding the paste, which is usually highly viscous, through a stencil or mask such as a perforated sheet by passing an extrusion nozzle over the mask located on the ceramic layer or greensheet of the MLC. This has not been found acceptable for high temperature superconductors such as La—Sr—Cu—O, Y—Ba—Cu—O and Bi—Sr—Ca—Cu—O materials since conventional fabrication techniques degrade the superconductor material resulting in a reduction in critical current density and lowering of the superconductor transition temperature making operation of the component at liquid nitrogen temperatures virtually impossible.

In general, a multilayer ceramic semiconductor package (MLC) is formed by stacking and bonding together flexible paper-like sheets commonly referred to as ceramic greensheets. Greensheet segments of desired size and configuration are punched to provide via holes and, by a screen printing technique, a conductive paste fills the via holes and a conductive circuit pattern is applied to the face of the greensheet as required. Such patterned greensheets, after screening, are assembled in a stack, pressed and subsequently sintered in an oven at a relatively high temperature. Upon sintering, the organics such as binders, dispersants, plasticizers, thixotropes, solvents, etc. are burned off providing a rigid unitary ceramic body having interior interconnected conductive patterns.

There are many types of MLC conductive pastes which are screened onto the greensheet circuit to form the patterns. In general, a metallic paste such as a molybdenum paste comprises molybdenum power, a solvent and a binder. A rheological modifier and/or dispersing agent may also be employed to control viscosity and pattern formation. The concentration of the various ingredients may vary widely with the proviso that a paste is formed which has a proper viscosity and which may be effectively applied to the greensheet or other surfaces by screening or other patterning techniques.

Typical solvents for the metal paste include n-butyl carbitol acetate, σ terpineol, n-butyl carbinol and the like. The binder includes materials such as ethyl cellulose, polyvinylbutyral and the like. The metal material has a fine particle size generally less than 10 microns on average. Typically, the metal pastes are prepared by adding the ingredients to a mill and mixing the ingredients until a homogenous paste is obtained.

In general, a complete conventional patterning process for greensheets may be described as follows. A ceramic slurry is prepared by mixing alumina (ceramic) powder, organic binder, plasticizer and solvent at a given mixing ratio in a conventional manner. The slurry is shaped into a tape by means of a tape caster and thereafter the resulting tape is dried and cut into a given length to form a plurality of unsintered soft ceramic sheets or so-called "greensheets".

Via holes are then punched in the sheets and circuit patterns are printed on the surface of each greensheet and the vias filled with a metallizing ink or paste using a screen (mask) printing process. The metallizing paste, as noted above, is typically a molybdenum paste although other metallic pastes such as tungsten may also be used. The sheets are then dried, stacked, laminated and thereafter sintered to form the MLC substrate.

The fabrication of multilayer ceramic substrates is described in U.S. Pat. Nos. 4,137,628; 4,803,110 and 4,902,371 and in Microelectronics Packaging Handbook, Edited by R. R. Tummala and E. J. Rymaszewski, 1989, pages 476–493. The disclosures of the above patents and references are incorporated herein by reference.

Bearing in mind the problems and deficiencies of the prior art with regard to the use of high temperature superconductors as wiring in MLC's, it is therefore an object of the present invention to provide a method for the fabrication of electronic components including MLC electronic components using high temperature superconductors as wiring and other circuitry and to fill the vias.

An additional object of the present invention is to provide an electronic component such as an MLC electronic component made using a high temperature superconductor material as a circuit forming material in the component.

Other objects and advantages of the invention will in part be obvious and will in part be apparent from the specification.

SUMMARY OF THE INVENTION

The above and other objects, which will be apparent to those skilled in the art, are achieved in the present invention which is directed in a first aspect to an electronic component such as a multilayer ceramic substrate having interconnected layer to layer high temperature superconductor material circuitry comprising a high temperature superconductor material being encased within a noble metal such as gold or silver and the vias having a noble coating on the wall of the via with the remainder of the via being filled with the high temperature superconductor material. The noble metal layers preferably have through-holess therein for direct connection of circuitry, typically vias, with the superconductor material (layer).

A preferred MLC substrate comprises:

a plurality of ceramic layers having circuitry thereon and circuit interconnecting vias;

a layer of gold or silver or other such noble metal on the via wall with the remainder of the via being filled with a high temperature superconductor material;

a first lower layer of gold or silver or other such noble material on the ceramic layer in the desired circuit pattern and having a dimension preferably as wide and more preferably a wider dimension than a next second intermediate layer;

a second intermediate layer of a high temperature superconductor material on the gold or silver first layer, the second layer of superconductor material being more preferably narrower than the silver or gold first layer and preferably at least only as wide as the silver or gold first layer; and a third upper layer of gold or silver on the superconductor second layer, the second intermediate layer being encased within the first and second gold or silver layers.

In a preferred aspect, the first lower layer of noble metal or the third upper layer of noble metal and preferably both layers have through-openings therein to provide for direct connection of circuitry such as vias with the superconductor first and/or third layers.

In a further aspect of the invention, a method for fabricating an electronic component such as a multilayer ceramic substrate having interconnected layer to layer circuitry comprises the steps of:

forming a plurality of greensheet ceramic substrate layers containing vias which are to be formed into a multilayer ceramic electronic component;

applying a gold or silver layer to the via wall leaving the remainder of the via open;

applying a high temperature superconductor material to the remainder of the via opening;

applying to the ceramic substrate layer a first lower layer of gold or silver or other noble metal on the greensheet in the desired circuit pattern and having a dimension preferably as wide and more preferably wider than a next second intermediate layer;

applying a second intermediate layer of high temperature superconductor material on the gold or silver layer, the layer of superconductor material being more preferably narrower than the gold or silver first layer and preferably at least only as wide as the gold or silver first layer;

applying a third upper layer of gold or silver on the superconductor layer so that the superconductor material is encased within the first and second gold or silver layers;

assembling the individual metallized greensheet ceramic substrates into a stack; and heating and sintering the assembled greensheet ceramic substrate stack to form the multilayer ceramic substrate product.

In a preferred method, through-openings are provided on the first lower layer of noble metal or the third upper layer of noble metal and preferably in both layers to provide for direct connection of circuitry such as vias to the superconductor layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
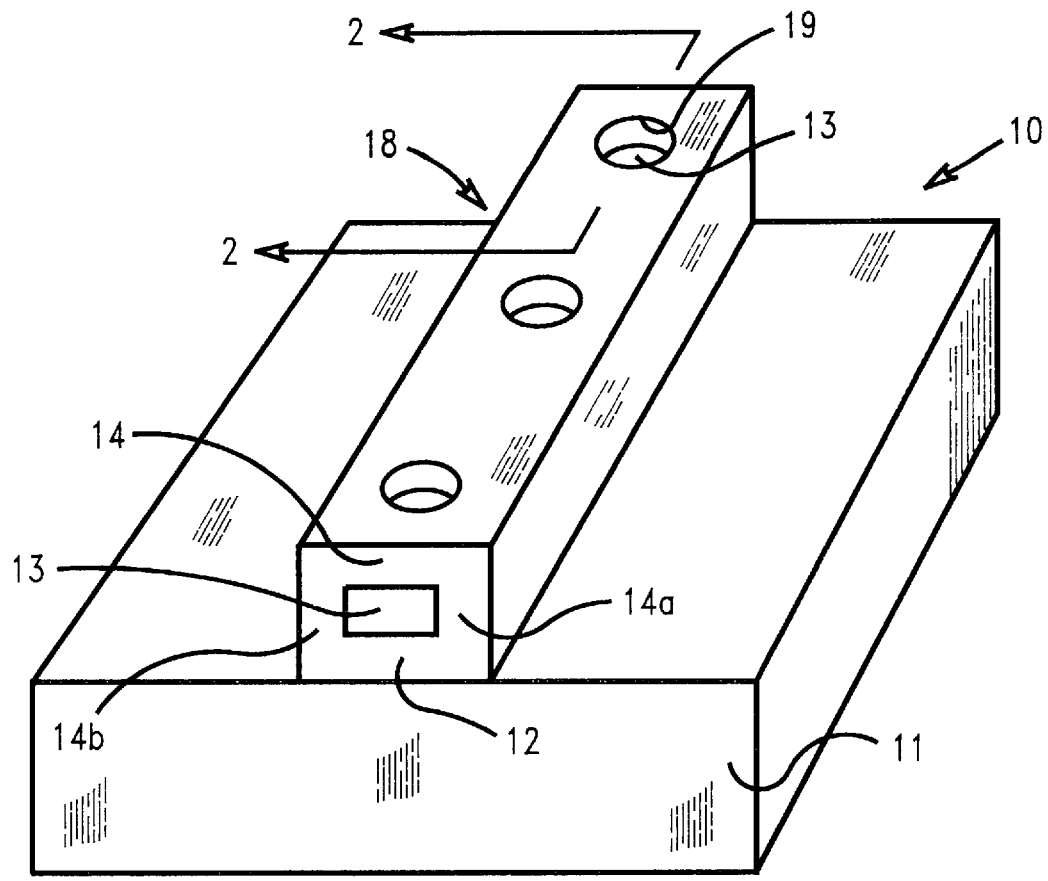
FIG. 1 is a perspective partial view of a greensheet having a superconductor material layer thereon in the form of a signal line.

In describing the preferred embodiments of the present invention, reference will be made herein to FIGS. 1–3 of the drawings in which like numerals refer to like features of the invention. Features of the invention are not necessarily shown to scale in the drawings.

Referring to FIG. 1, a metallized ceramic greensheet having metallization thereon in the form of a signal line is shown generally as 10. The metallized greensheet comprises a greensheet substrate 11 having a signal line wiring thereon shown generally as 18. The signal line wiring 18 comprises a lower first layer 12 of gold or silver, a narrower intermediate second layer 13 of a high temperature superconductor material and an upper third layer 14 of gold or silver. The superconductor material 13 is completely enclosed (encased) within the gold or silver layers as shown by gold or silver lateral areas 14a and 14b. Through-openings 19 in upper layer 14 extend to superconductor layer 13 for direct connection of circuitry such as vias to superconductor layer 13.

Figure 2:
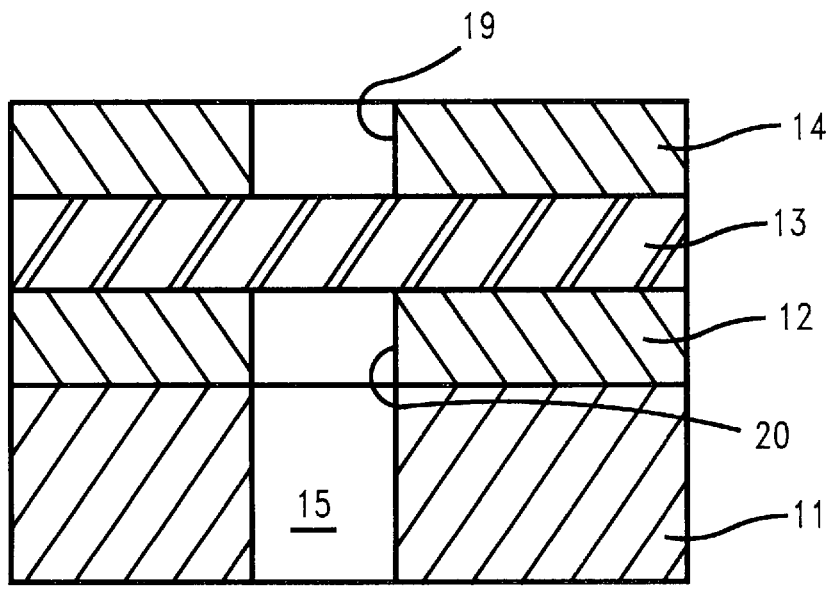
FIG. 2 is a cross-sectional view of the greensheet and signal line of FIG. 1 taken along line 2—2.

FIG. 2 is a cross-sectional view of FIG. 1 and shows greensheet layer 11, lower first layer 12 of gold or silver, intermediate second layer 13 of a high temperature superconductor material and an upper third layer 14 of gold or silver. Through-openings 19 and 20 extend through noble metal layers 14 and 12, respectively, to allow direct connection of via 15 to superconductor layer 13.

Figure 3:
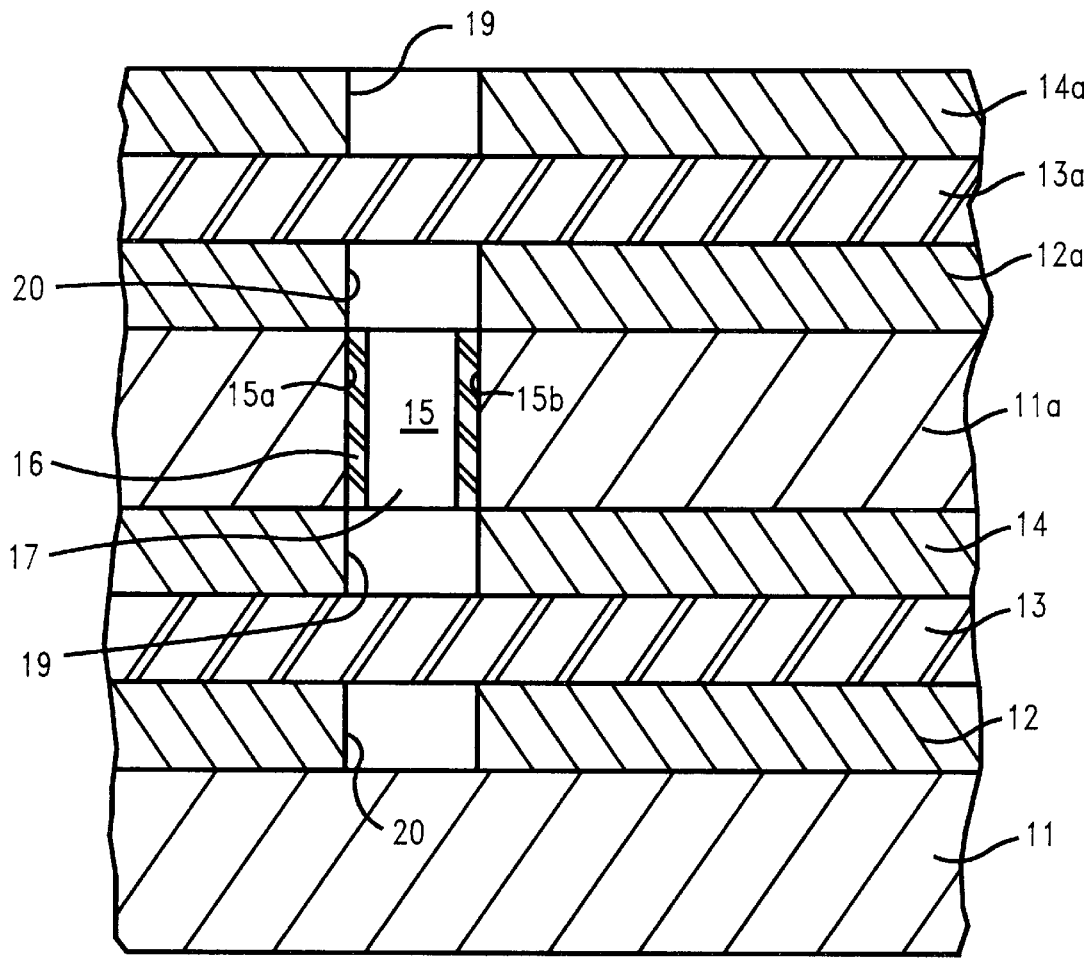
FIG. 3 is a cross-sectional view of a ceramic greensheet stack of the invention having upper and lower interconnected superconductor circuitry.

FIG. 3 shows a cross-sectional side view of a greensheet 11a containing a via 15 having opposed walls 15a and 15b. The greensheet 11a has applied to the upper surface thereof a gold or silver first layer 12a, an intermediate second layer 13a of a high temperature superconductor material and an upper third layer 14a of gold or silver. Similarly, at the lower surface of greensheet 11a there is another stacked greensheet comprising a greensheet 11, a gold or silver layer 12, an intermediate layer 13 of a high temperature superconductor material and a layer 14 of gold or silver. Through-openings 19 and 20 allow for direct connection of via 15 to superconductor layers 13a and 13. The via 15 is shown having a layer 16 of gold or silver on the opposed walls 15a and 15b of the via 15 which layers extend around the via opening wall. The remainder of the via 15 is filled with a high temperature superconductor material 17. The interconnection of the circuitry of the lower greensheet to the circuitry of the upper greensheet 11a is through via 15 in greensheet 11a. When the stacked greensheets are sintered to form the multi-layer ceramic electronic component, openings 19 and 20 in the noble metal layer allow compression of the stack in that area so that the superconductor layer is in direct contact with the superconductor metal of the via connected thereto.

The electronic components of the invention may be made using fabrication techniques known in the art. As described hereinabove, a screen printing technique is generally used to form conductor lines and to fill vias using a conductive paste. To fill the vias, the via walls are coated with a layer of silver or gold using paste characteristics and screening conditions that form sunshine vias, i.e., vias that have paste on the circumferential wall of the via but have a central hole running the whole length of the via still exists. Once the walls are layered with silver or gold, the via is filled with the semiconductor paste using conventional techniques to fill the remainder of the via. To fill the vias, the following procedures, for example, could be used. In one process, paste with optimized viscosity can be screened using an extrusion head screener, which forces the paste into the vias. In another process, a bladder fill type screener can be used wherein a layer of paste is applied to a masked greensheet and a uniform pressure (from the bladder) forces the paste into the vias. A paste can also be screened using vacuum on the underside of the sheet to pull paste into the vias. Combinations of the above processes as well as other processes may also be employed.

When the greensheets are prepared, they are stacked and sintered as discussed hereinabove. The stacks of the subject invention must be sintered in an atmosphere which prevents degradation of the superconductor material, e.g., an oxidizing atmosphere and preferably pure oxygen. A typical firing cycle is similar to that for a glass ceramic sintering cycle as shown in U.S. Pat. No. 4,234,367, with the important atmosphere change, e.g., oxygen atmosphere, as noted above. The disclosure of the patent is hereby incorporated by reference. The stack can be free sintered (without constraints) but it is preferred to use conformal sintering whereby shrinkage of the stack during sintering is in the z direction and enhanced stack dimensional stability is obtained.

In the subject invention, one of the conductive pastes would be made using a noble metal such as silver or gold and the other conductive paste is made from a high temperature superconductor such as La—Sr—Cu—O, Y—Ba—Cu—O and Bi—Sr—Ca—Cu—O which are exemplary of high temperature superconductors. The superconductor material typically having a particle size of 1 to 10 microns may be formed into a paste or other form which would be capable of being transferred to substrate such as by screen printing. For example, one of the above superconductors could be made into a paste by mixing the necessary ingredients in the required proportions and then dispersing the solids into an organize matrix by milling Dn a three-roll mill.

For the noble metal layers, these will generally be silver or gold, but may also include non-noble metals that may act as a barrier layer. The noble metals, such as the conventional metals used in the prior art such as molybdenum, may be formed into a conductive paste using a powder of the metal, a solvent and a binder. A thixotrope may also be employed to control viscosity and pattern formation.

The concentration of the metal in the paste, whether it be a high temperature superconductor material or a noble metal such as silver or gold may vary widely with the proviso that a paste is formed which has a proper viscosity and which may be effectively applied to the greensheet or other surface by screening or other application techniques.

After screening, the substrate will be dried to remove any solvent with the remaining metal on the substrate in form of the desired circuit pattern. As described above, the metallizing paste whether it be the gold or silver layer or high temperature superconductor layer is preferably applied to the substrate using a screen (mask) printing process. As described hereinabove for FIG. 1, the noble metal layer is first applied to the substrate and preferably has a wider dimension than the next second intermediate layer which will comprise the superconductor material. Once the first layer is applied, the superconductor material will be applied to the surface of the first layer and will preferably be narrower than the first layer. Once the superconductor layer is applied, the third upper layer of gold or silver is then applied to the superconductor second layer encasing the superconductor layer. Through-openings will preferably be formed in either or both noble metal layers as described hereinabove. In some cases, the superconductor layer may be the same width or wider than the lower layer with the upper layer being applied to the superconductor layer so that it overflows the sides of superconductor layer and the lower layer encasing the superconductor layer within the silver or gold structure.

Other techniques to apply the metals to form the layers or fill the vias on the substrates may be used such as decal transfer, spray printing or thick film photolithographic processes.

EXAMPLE:

A high temperature superconductor material was formed into signal lines by enclosing (encasing) the superconductor in gold using screen printing procedures as described hereinabove. The high temperature superconductor used was yttrium-barium-copper-oxide. The superconductor signal line was tested at room temperature and at a liquid nitrogen temperature (77 K). The resistance of the lines dropped from 5–6 mOhm at room temperature to 1.3 mOhm at 77 K indicating superconducting transition in the lines.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A multilayer ceramic substrate having interconnected layer to layer wiring and via circuitry wherein the wiring circuitry layer comprises a high temperature superconductor material encased within noble metal layers and the interconnecting via circuitry comprises a noble metal coating on the wall of the via with the remainder of the via being filled with a high temperature superconductor material.

2. The multilayer ceramic substrate of claim 1 wherein the noble metal is gold or silver.

3. The multilayer ceramic substrate of claim 2 wherein the noble metal layers have through-openings for direct connection of the encased superconductor material with a via or other superconductor circuitry.

4. The multilayer ceramic substrate of claim 3 wherein the superconductor material is selected from the group consisting of La—Sr—Cu—O, Y—Ba—Cu—O, and Bi—Sr—Ca—Cu—O.

5. A multilayer ceramic substrate comprising:
   a plurality of ceramic layers having a wiring circuitry pattern thereon and circuit interconnecting vias wherein the ceramic layers comprise:
     a layer of noble metal on the via walls with the remainder of the via being filled with a high temperature superconductor material;
     a first lower layer of noble metal on the ceramic layers in the desired wiring circuit pattern and having a wider dimension than a next second intermediate layer;

a second intermediate layer of a high temperature superconductor material on the noble metal first lower layer, the second layer of superconductor material being narrower than the noble metal layer; and
   a third upper layer of noble metal on the superconductor second intermediate layer, the second intermediate layer being encased within the first and second noble metal layers.

6. The multilayer ceramic substrate of claim 5 wherein the noble metal is gold or silver.

7. The multilayer ceramic substrate of claim 6 wherein the noble metal layers have through-openings for direct connection of the encased superconductor material with a via or other superconductor circuitry.

8. The multilayer ceramic substrate of claim 7 wherein the superconductor material is selected from the group consisting of La—Sr—Cu—O, Y—Ba—Cu—O, and Bi—Sr—Ca—Cu—O.

* * * * *